(12) United States Patent
Ghoshal

(10) Patent No.: US 6,429,694 B1
(45) Date of Patent: Aug. 6, 2002

(54) APPARATUS AND METHOD IN AN INTEGRATED CIRCUIT FOR DELAY LINE PHASE DIFFERENCE AMPLIFICATION

(75) Inventor: Uttam Shyamalindu Ghoshal, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/471,522

(22) Filed: Dec. 23, 1999

Related U.S. Application Data

(63) Continuation of application No. 09/032,814, filed on Mar. 2, 1998.

(51) Int. Cl.[7] .............................................. G01R 25/00
(52) U.S. Cl. ............................. 327/23; 327/3; 327/146; 327/153
(58) Field of Search .............................. 327/3, 2, 5, 7, 327/8, 12, 141, 144, 146, 147, 153, 23, 24, 26

(56) References Cited

U.S. PATENT DOCUMENTS

| | | | | |
|---|---|---|---|---|
| 3,646,455 A | * | 2/1972 | Coccagna .................... 327/12 |
| 4,277,754 A | * | 7/1981 | Minakuchi .................. 327/12 |
| 4,751,469 A | * | 6/1988 | Nakagawa et al. ............ 327/7 |
| 5,266,851 A | * | 11/1993 | Nukui ............................ 327/3 |
| 5,289,135 A | * | 2/1994 | Hoshino et al. ................ 327/3 |
| 5,631,582 A | * | 5/1997 | Fujikawa ...................... 327/12 |
| 5,682,113 A | * | 10/1997 | Park et al. .................... 327/174 |
| 5,896,066 A | * | 4/1999 | Katayama et al. ............ 331/17 |

FOREIGN PATENT DOCUMENTS

| | | | | |
|---|---|---|---|---|
| EP | 000353807 A1 | * | 2/1992 | .................. 327/3 |
| JP | 404035522 | * | 2/1992 | ................. 327/12 |

* cited by examiner

*Primary Examiner*—Timothy P. Callahan
*Assistant Examiner*—Hai L. Nguyen
(74) *Attorney, Agent, or Firm*—Casimer K. Salys; Bracewell & Patterson, L.L.P.

(57) ABSTRACT

An apparatus and method in an integrated circuit for detecting phase differences between clock signals originating from an oscillator circuit. The oscillator circuit is formed on a substrate, such that the oscillator circuit is coupled to coincidence elements responsive to clock signals originating from the oscillator circuit. In addition, a coincidence circuit is provided that includes the coincidence elements, such that the coincidence circuit provides output signals only in response to a change in all clock signals originating from the oscillator circuit. The apparatus includes a delay circuit responsive to the output signals, such that the delay circuit stretches delays between the clock signals. A phase detector is coupled to the delay circuit, such that the phase detector is responsible for detecting phase differences between the clock signals by identifying the delays. The phase detector circuit is further coupled to a buffer circuit which compensates phase differences by delaying a faster clock signal until an associated clock signal matches the phase of the faster clock signal.

16 Claims, 4 Drawing Sheets

APPARATUS AND METHOD IN AN INTEGRATED CIRCUIT FOR DELAY LINE PHASE DIFFERENCE AMPLIFICATION

This application is a continuation of U.S. appl. No. 09/032,814, filed Mar. 2, 1998.

BACKGROUND OF THE INVENTION

1. Technical Field

The present invention relates in general to digital and analog integrated circuits, and in particular to digital and analog oscillator circuits. More particularly, the present invention relates to phase detectors utilized in integrated circuits. Still more particularly, the present invention relates to phase locked loop circuits. In addition, the present invention relates to methods and systems for detecting phase differences in clock signals utilized in phase locked loop circuits.

2. Description of the Related Art

It is often desirable to detect phase differences between two signals generated by integrated circuits. A phase difference, graphically represented by the symbol, "ø", is the difference in phase between two periodically varying quantities of the same frequency. The phase difference may be expressed as an angle (i.e, the "phase angle") or as function of time. The phase itself is simply the stage of a periodically recurring quantity, and is a fraction of the period that has elapsed with respect to a fixed datum point.

An example of a type of integrated circuit in which it is desirable to detect such phase differences is a phase-locked loop (PLL) circuit. A phase-locked loop circuit is a type of circuit that utilizes feedback to maintain an output signal in specific relationship with a reference signal. Phase-locked loop circuits are utilized in many areas of electronics to control the frequency and/or phase of a signal. These applications include frequency synthesizers, analog and digital modulators and demodulators, and clock recovery circuits.

A phase-locked loop circuit typically includes a phase detector which compares two signals. A problem that every circuit designer must face, however, is the difficulty in amplifying the phase difference for efficient and relatively easy detection. For example, when two signals whose phases are relatively synchronized, but remain 20 picoseconds apart, it is very difficult for the phase detector utilized by the phase-locked loop circuit to exactly determine whether one signal is running ahead of or behind the other signal.

The phase detector, a circuit which produces an output proportional to the phase difference between two inputs, detects a positive difference or a negative difference for the same phase, often resulting in misleading determinations and inaccurate data. Ideally, to avoid misleading determinations and inaccurate data, a delay should be amplified first. If the phase difference is expanded from 20 picoseconds to 100 picoseconds, the phase detector may readily detect which signal is running ahead of or behind the other.

Most prior art designs have been chiefly based on analog techniques. A multiplier is a device that has two or more inputs and that produces an output of magnitude equal to the product of the magnitudes of the input signals. In analog-signal processing, the need often arises for a circuit which takes two analog inputs and produces an output proportional to their product. Such circuits are termed analog multipliers. Utilizing such analog multipliers and other similar analog-based techniques, results in a "dead zone" in the phase difference. As the phase difference becomes increasingly narrow, the detection capability about the phase difference approaches zero (i.e., the dead zone) and becomes very poor.

From the foregoing, it can be appreciated that a need exists for a circuit technique which would limit or eliminate altogether a phase difference that approaches a zero value in phase-locked loop circuits, particularly those integrated circuits which are based on asynchronous designs. In view of the fact that detecting phase differences in phase-locked loop circuits is often a particularly difficult task, any improvements in the ability to detect phases in such circuits would be a welcome advance to the integrated circuit arts. Such an advance would improve both the efficiency and speed of circuits which take advantage of phase-locked loop circuits.

SUMMARY OF THE INVENTION

It is therefore one object of the present invention to provide improved integrated circuits.

It is therefore another object of the present invention to provide improved digital and analog oscillator circuits.

It is yet another object of the present invention to provide improved phase detectors utilized in digital and analog oscillator circuits.

It is yet another object of the present invention to provide an improved phase locked loop circuit utilized in digital and analog oscillator circuits.

It is still another object of the present invention to provide an improved method and system for detecting phase differences evidenced in phase locked loop circuits.

The above and other objects are achieved as is now described. An apparatus and method in an integrated circuit for detecting phase differences between clock signals originating from an oscillator circuit. The oscillator circuit is formed on a substrate, such that the oscillator circuit is coupled to coincidence elements responsive to clock signals originating from the oscillator circuit. In addition, a coincidence circuit is provided that includes the coincidence elements, such that the coincidence circuit provides output signals only in response to a change in all clock signals originating from the oscillator circuit. The apparatus includes a delay circuit responsive to the output signals, such that the delay circuit stretches delays between the clock signals. A phase detector is coupled to the delay circuit, such that the phase detector is responsible for detecting phase differences between the clock signals by identifying the delays. The phase detector circuit is further coupled to a buffer circuit which compensates phase differences by delaying a faster clock signal until an associated clock signal matches the phase of the faster clock signal.

BRIEF DESCRIPTION OF THE DRAWINGS

The novel features believed characteristic of this invention are set forth in the appended claims. The invention itself, however, as well as a preferred mode of use, further objects, and advantages thereof, will best be understood by reference to the following detailed description of a preferred embodiment when read in conjunction with the accompanying drawings, wherein:

DETAILED DESCRIPTION OF PREFERRED EMBODIMENT

Figure 1:
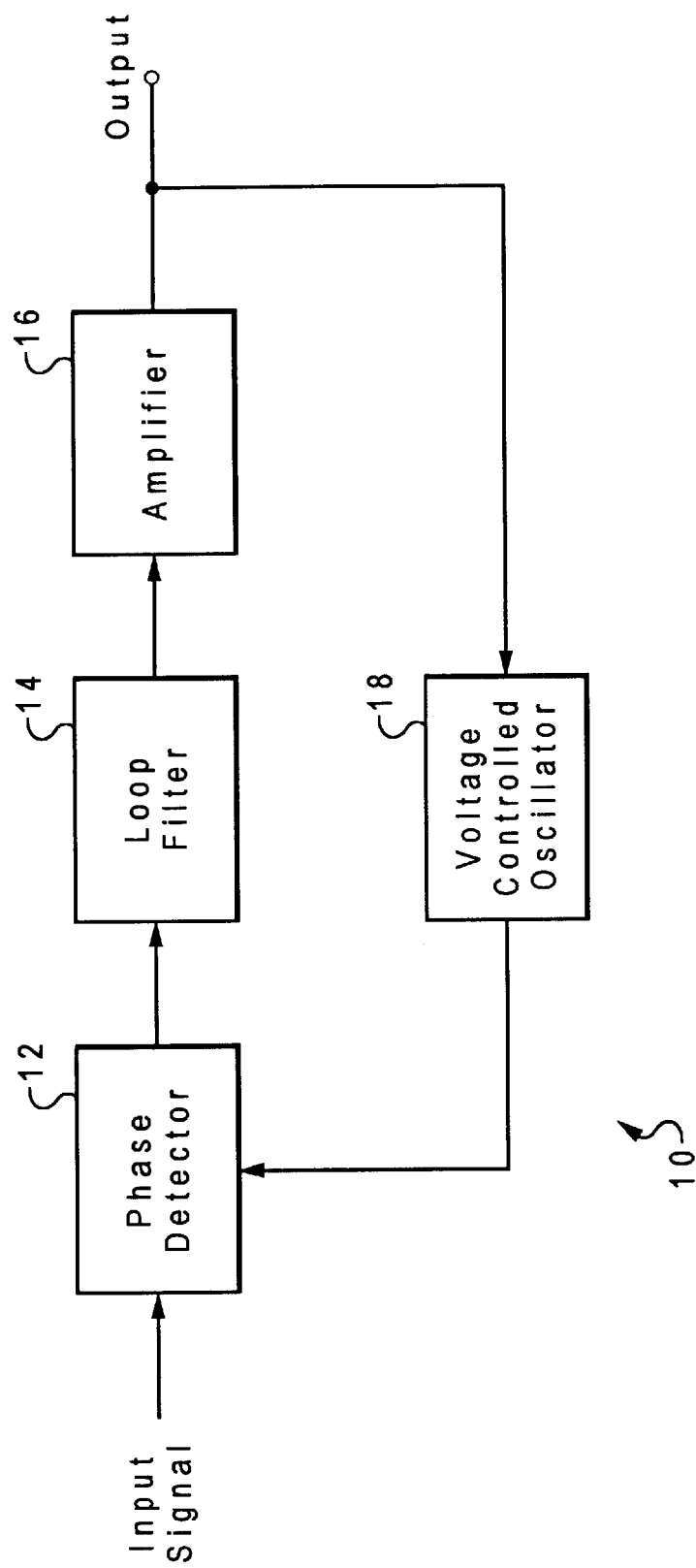
FIG. 1 illustrates a block diagram illustrative of a prior art phase-locked loop system.

With reference now to the figures and in particular with reference to FIG. 1, there is depicted a block diagram 10 illustrative of a prior art phase-locked loop system. Those skilled in the art will appreciate that block diagram 10 is presented for illustrative purposes only, and is intended to present the reader with a general background appreciation for phase-locked loop systems in order to better appreciate the function of preferred embodiments of the present invention depicted herein. The phase-locked loop system depicted in block diagram 10 of FIG. 1 includes a phase comparator 12, a loop filter 14, an amplifier 16 and a voltage-controlled oscillator 18.

Voltage controlled oscillator 18 is an oscillator that possesses a frequency proportional to an externally applied voltage. Voltage controlled oscillator 18 is exactly equal to that of an incoming signal when the loop is locked on an incoming periodic signal. Phase detector 12 is a circuit that produces an output whose DC component is proportional to the phase difference between two inputs. In the phase-locked loop system of block diagram 10, phase detector 12 is responsible for producing a direct-current (DC) or low-frequency signal proportional to a phase difference between the incoming signal (i.e., input signal supplied to phase detector 12) and a signal produced by voltage controlled oscillator 18. This phase-sensitive signal is subsequently passed through loop filter 14 and amplifier 16, and applied to the control input of voltage controlled oscillator 18.

If the frequency of the incoming signal shifts slightly, the phase difference between the voltage controlled oscillator signal and the incoming signal will begin to decrease with time. The control voltage on the voltage controlled oscillator is then altered in such a manner as to bring the voltage-controlled oscillator frequency back to the same value as the incoming signal. The loop thus maintains a lock when the input signal frequency is altered, and the voltage controlled oscillator input voltage is proportional to the frequency of the incoming signal.

Figure 2A:
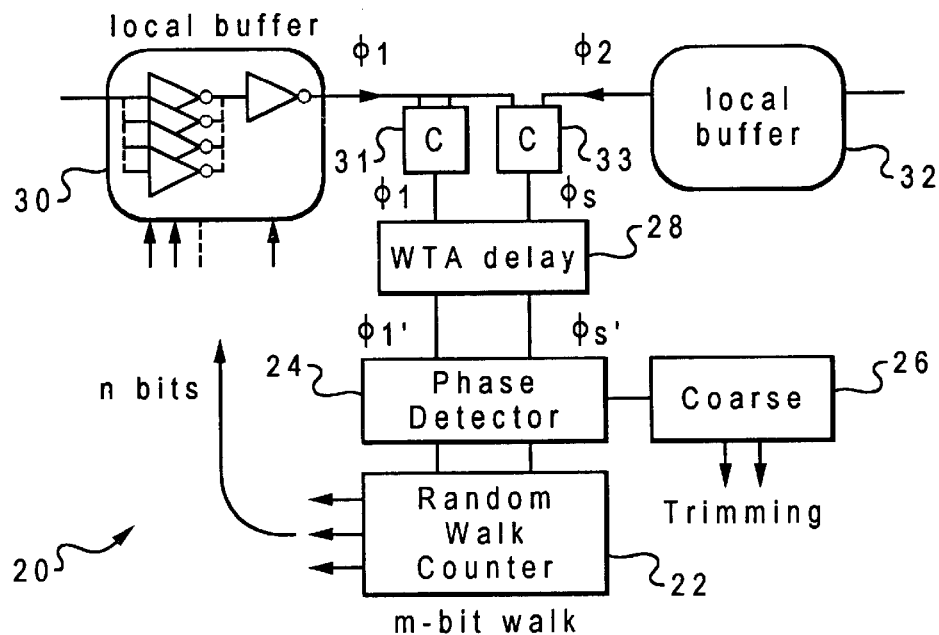
FIG. 2(a) depicts a block diagram illustrative of a circuit responsible for distributed phase alignment, in accordance with a preferred embodiment of the present invention.

FIG. 2(a) depicts a block diagram 20 illustrative of a circuit responsible for distributed phase alignment, in accordance with a preferred embodiment of the present invention. The circuit depicted in block diagram 20 of FIG. 2(a) includes a chain of inverter trails (i.e., regular CMOS inverters), as illustrated at local buffer 30. The objective of the circuit depicted in block diagram 20 of FIG. 2(a) is to align the clock signals. $\phi_1$ is an output signal produced by the chain of inverter trails illustrated at local buffer 30. $\phi_2$ is an output signal produced by local buffer 32. Local buffer 32 also includes a chain of inverter trails similar to the chain of inverter trails shown within the block illustrated as local buffer 30.

Figure 4:
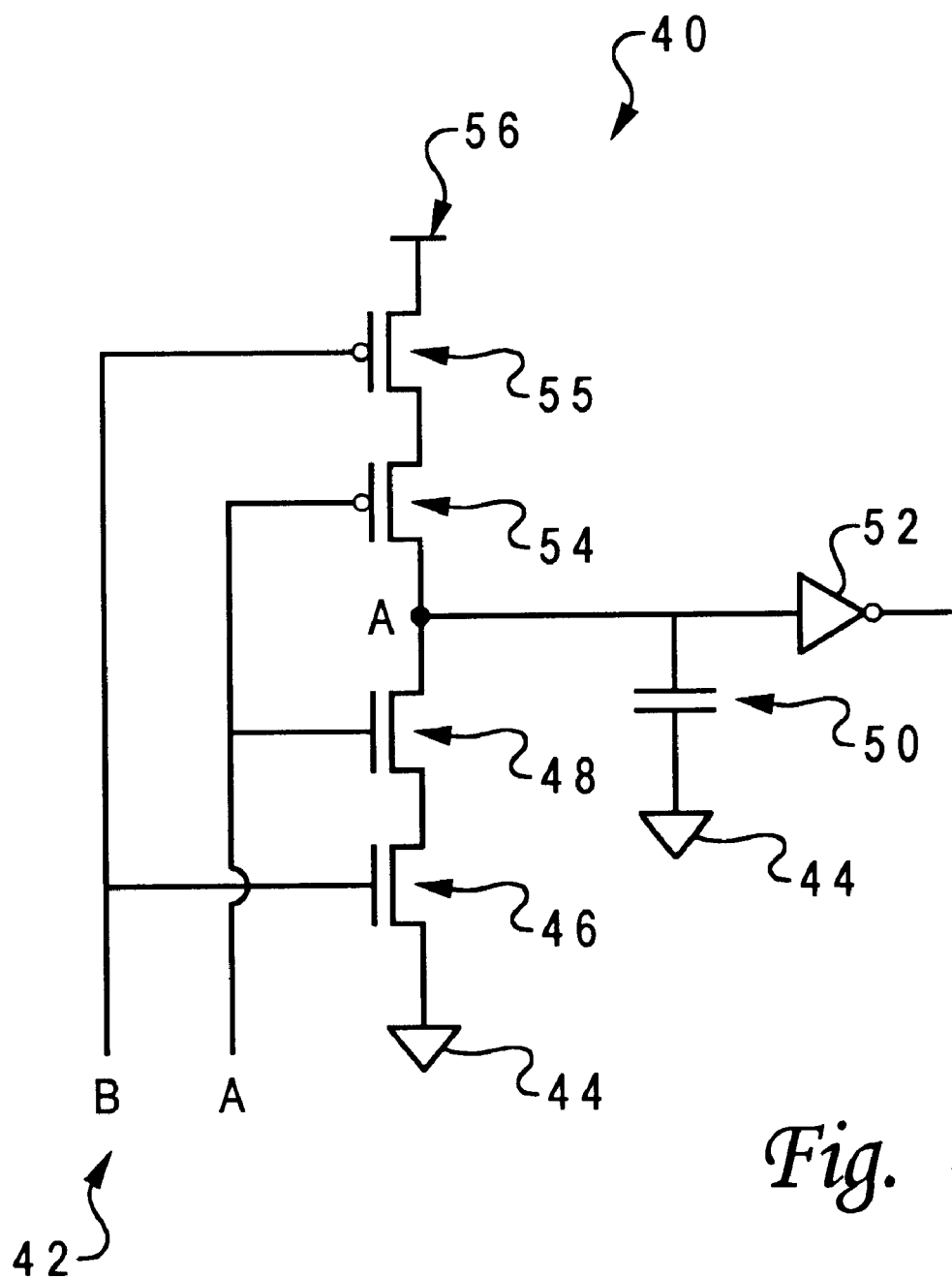
FIG. 4 depicts a schematic diagram illustrative of a circuit that incorporates coincidence elements, in accordance with a preferred embodiment of the present invention.

A buffer circuit, such as local buffer 32, is essentially an isolating circuit, interposed between two circuits to minimize reaction from the output to the input. Buffer circuits typically include a high input impedance and a low output impedance, and may be utilized to handle a large "fan out", or to convert input and output voltage levels. Signals $\phi_1$ and $\phi_2$ are each fed into coincidence elements 31 and 33, which are structures utilized widely in asynchronous circuits. A coincidence circuit is a circuit with two or more input terminals that produces an output signal only when an input signal is received by each input either simultaneously or within a specified time interval. FIG. 4, illustrated herein, depicts a specific example of a coincidence circuit. Coincidence elements 31 and 33 form such a coincidence circuit. A property associated with such a coincidence circuit can be summarized as follows: if one input is altered, the state of the output is not necessarily also altered. The circuit waits until the second input changes. In a coincidence circuit having A and B inputs, both A and B must change in order for the output state to also change. When either input signal A or B changes a direction, the circuit waits for both signals to change prior to changing the circuit output. Such a circuit scheme is fairly common in asynchronous designs to resynchronize signals. Output from coincidence element 31 comprises signal $\phi_s$, that is, the later of the two clock signals $\phi_1$ and $\phi_2$.

Figure 2B:
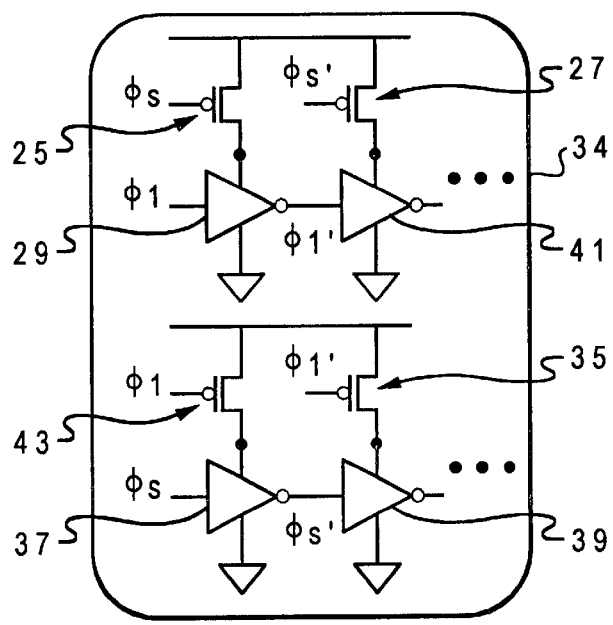
FIG. 2(b) illustrates a block diagram illustrative of a "winner-take-all" (WTA) delay circuit, in accordance with a preferred embodiment of the present invention.

The coincidence elements are connected together in such manners as to select the later of the two signals as $\phi_s$. Thereafter, a delay circuit amplifies the difference. This delay circuit, referred to herein as a "winner-take-all" (WTA) delay circuit is specifically illustrated within block 34 of FIG. 2(b). Thus, the circuit depicted within block 34 of FIG. 2(b) illustrates the circuit illustrated at block 28 of FIG. 2(a). Signal $\phi_s$ is fed to a gate of transistor 25, which is connected to inverter 29. Signal $\phi_1$ is fed as input to inverter 29. Output from inverter 29, exemplified within FIG. 2(b) as signal $\phi_1'$ is fed as input to inverter 41. Inverter 41 is connected to transistor 27 whose gate receives as input signal $\phi_s'$. Signal $\phi_1$ is also fed as input to transistor 43. Signal $\phi_s$ is also fed as input to inverter 37 whose output, signal $\phi_s'$ is fed as input to inverter 39. In addition, signal $\phi_1'$ is fed as input to the gate of transistor 35.

Figure 3:
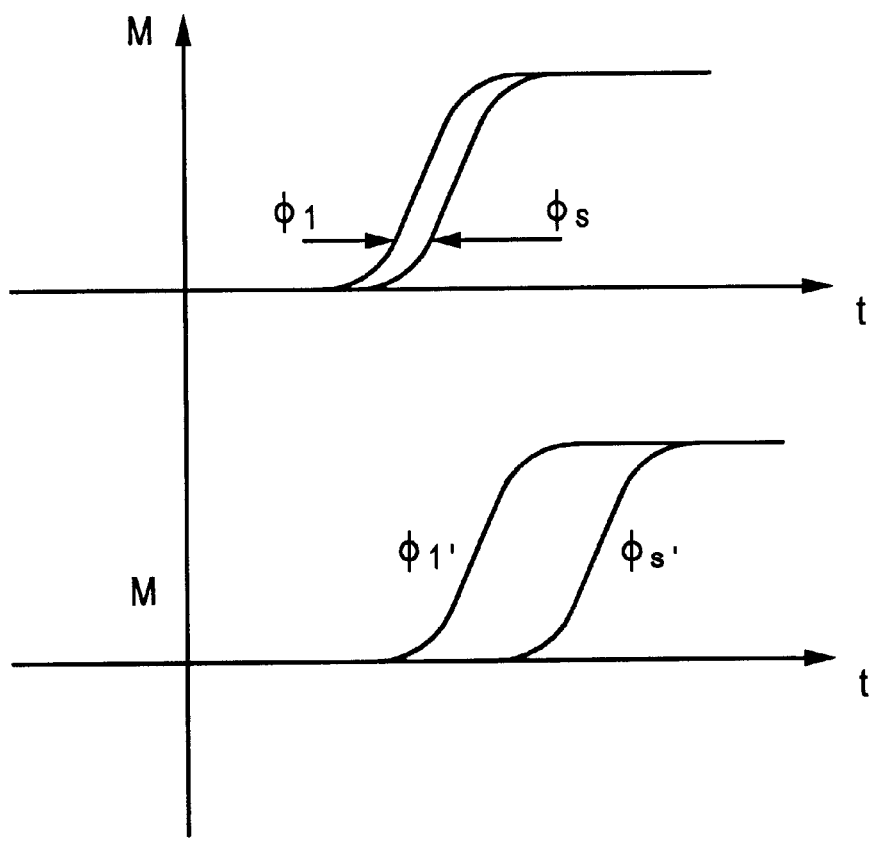
FIG. 3 illustrates a phase alignment diagram in accordance with a preferred embodiment of the present invention.

Signals $\phi_1$ and $\phi_s$ are very closely spaced. When the slower of the two signals (i.e., $\phi_s$) remains at "zero," the other signal races ahead. The faster signal travels even faster, while the slower signal is further retarded in the chain. Output from WTA delay circuit 28 is illustrated within block diagram 20 of FIG. 2(a) as $\phi_1'$ and $\phi_s'$. At the output of WTA delay circuit 28, the delay is stretched as illustrated in FIG. 3. FIG. 3 illustrates a phase diagram in accordance with a preferred embodiment of the present invention. Signals $\phi_1'$ and $\phi_s'$ are fed to phase detector 24, which is a circuit that functions analogously to phase detector 12 of FIG. 1.

Once phase detector 24 determines the difference in the phases of the clock signals, the number of the inverters in the buffer is reduced, which in turn delays the faster clock until the two signals match. Thus, phase detector 24 is connected to a coarse circuit 26, a buffer whose output results in trimming signals. In addition, phase detector 24 is connected to a random walk counter circuit having an m-bit walk. Output from random walk counter circuit 22 is fed to local buffer 30 and the chain of inverter trails included within local buffer 30.

The context in which the invention is utilized is a closed loop circuit, such as the phase locked loop circuit depicted in FIG. 1. However, those skilled in the art will appreciate that the circuit depicted in FIG. 2(a) and FIG. 2(b) can be modified and utilized for other applications. For example, if clock signals are distributed to different domains having subclocks, it is desirable to have data signals from one domain transferred to another domain such that these signals are nearly aligned as possible. Thus, phase differences can also be addressed at the local level in order to remove any potential misalignment. Those skilled in the art will appreciate that the clock signals are often so close that they effectively represent the same signal, the only difference being that each signal is located on a different transmission line. Thus, the circuit depicted in FIG. 2(a) and FIG. 2(b) may be modified in order to stretch the phase difference.

FIG. 4 depicts a schematic diagram illustrative of a circuit 40 that incorporates coincidence elements, in accordance with a preferred embodiment of the present invention. Circuit 40 includes input lines 42 having an input B and an input A. Input A is connected to the gate of a p-transistor 54 and the gate of an n-transistor 48. Input B is connected to the gate of a p-transistor 55 and the gate of an n-transistor 46. N-transistor 48 is connected in series to n-transistor 46. N-transistor 46 is further coupled to ground 44, while p-transistor 56 is connected to power supply 56 (VDD). The source of p-transistor 54 is connected to the source of n-transistor 48 at node A. Node A is connected to capacitor 50, which is coupled to ground 44. Node A is further coupled to inverter 52.

The embodiments and examples set forth herein are presented in order to best explain the present invention and its practical application and, thereby, to enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. An apparatus in an integrated circuit formed on a substrate for detecting minute phase differences between clock signals, comprising:
    a coincidence circuit responsive to a first and slower second clock signals, wherein said coincidence circuit provides a first output signal in response to said first clock signal and a second output signal in response to both said first clock signal and said slower second clock signal wherein said first output signal and said second output signal are separated in time in response to differences in said first and slower second clock signals;
    a delay circuit responsive to said output signals provided by said coincidence circuit, wherein said delay circuit increases delays between said first and slower second clock signals; and
    a phase detector responsive to said delay circuit, wherein said phase detector identifies delays between said first and slower second clock signals, such that differences between said first and slower second clock signals are easily detected.

2. The apparatus of claim 1 wherein said coincidence circuit further comprises coincidence elements responsive to said first and slower second clock signals.

3. The apparatus of claim 2 wherein said coincidence elements of said coincidence circuit further comprise:
    a first coincidence element having as input a first clock signal; and
    a second coincidence element having as input said first clock signal and said slower second clock signal.

4. The apparatus of claim 3 wherein said first coincidence element provides as a first output signal, said first clock signal.

5. The apparatus of claim 4 wherein said second coincidence element provides as a second output, the slower of said first clock signal or said slower second clock signal.

6. The apparatus of claim 5 wherein said delay circuit responsive to said output signals, wherein said delay circuit increases delays between said first and slower second clock signals, further comprises:
    a delay circuit responsive to said output signals, such that said output signals comprise said first clock signal and said slower second clock signal, wherein said delay circuit increases delays between said first clock signal and said slower second clock signal.

7. The apparatus of claim 6 further comprising:
    a first buffer circuit responsive to said oscillator circuit, wherein said first buffer circuit is coupled to said first coincidence element and said second coincidence element such that said first clock signal travels through said first buffer circuit from said oscillator circuit to said coincidence circuit; and
    a second buffer circuit responsive to said oscillator circuit, wherein said second buffer circuit is coupled to said second coincidence element such that said slower second clock signal travels through said second buffer circuit from said oscillator circuit to said coincidence circuit.

8. The apparatus of claim 7 wherein each of said first and second buffer circuits comprise a chain of inverter trails.

9. The apparatus of claim 8 further comprises a counter circuit whose output provides bit data to said first local buffer and whose input is responsive to output from said phase detector.

10. The apparatus of claim 9 wherein said delay circuit comprises a winner-take-all delay circuit.

11. A method in an integrated circuit for detecting phase differences between clock signals, said method comprising the steps of:
    coupling first and slower second clock signals to a coincidence circuit comprising coincidence elements, wherein said coincidence circuit provides a first output signal in response to said first clock signal and a second output signal in response to both said first clock signal and said slower second clock signal, wherein said first output signal and said second output signal are separated in time in response to differences in said first and slower second clock signals;
    transferring said output signals to a delay circuit responsive to said output signals, wherein said delay circuit increases delays between said first and slower second clock signals; and
    detecting phase differences between said clock signals by utilizing a phase detector to detect phase differences between said first and slower second clock signals by identifying said delays.

12. The method of claim 11 further comprising the step of:
    connected said phase detector to a buffer circuit which compensates phase differences between said signals by delaying an identified faster clock signal until an associated clock signal matches the phase of said faster clock signal.

13. The method of claim 12 wherein the step of transferring said output signals to the delay circuit responsive to said output signals, wherein said delay circuit increases delays between said first and slower second clock signals, further comprises the step of:
    transferring said output signals to the delay circuit responsive to said output signals, wherein said output signals comprise said first clock signal and said slower second clock signal, such that said delay circuit increases delays between a first clock signal and a slower second clock signal.

14. The method of claim 13 Further comprising the step of forming each of said first and second buffer circuits from a chain of inverter trails.

15. The method of claim 12 further comprising the steps of:

coupling a first buffer circuit responsive to said oscillator circuit to said first coincidence element such that said first clock signal travels through said first buffer circuit from said oscillator circuit to said coincidence circuit; and connecting a second buffer circuit responsive to said oscillator circuit, to said first coincidence element and said second coincidence element such that said second slower clock signal travels through said second buffer circuit from said oscillator circuit to said coincidence circuit.

16. The method of claim 15 further comprises the step of connecting an input of a counter circuit to an output of said phase detector such that said counter circuit provides bit data to said first local buffer.

* * * * *